US009691875B2

(12) United States Patent
Sasaki

(10) Patent No.: US 9,691,875 B2
(45) Date of Patent: Jun. 27, 2017

(54) METHOD OF MANUFACTURING NITRIDE SEMICONDUCTOR DEVICE

(71) Applicant: Mitsubishi Electric Corporation, Tokyo (JP)

(72) Inventor: Hajime Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/747,823

(22) Filed: Jun. 23, 2015

(65) Prior Publication Data
US 2016/0141385 A1 May 19, 2016

(30) Foreign Application Priority Data

Nov. 17, 2014 (JP) ................................. 2014-232808

(51) Int. Cl.
*H01L 29/66* (2006.01)
*H01L 21/324* (2006.01)
(Continued)

(52) U.S. Cl.
CPC ...... *H01L 29/66462* (2013.01); *H01L 21/324* (2013.01); *H01L 29/7786* (2013.01); *H01L 29/2003* (2013.01)

(58) Field of Classification Search
CPC .... H01L 29/778–29/8128; H01L 29/20; H01L 29/2003; H01L 29/0642; H01L 29/0607; H01L 21/263; H01L 21/268; H01L 21/428; H01L 21/02356; H01L 21/02359; H01L 21/02433; H01L 21/02667; H01L 21/18; H01L 21/182; H01L 21/2022; H01L 21/2026;
(Continued)

(56) References Cited

U.S. PATENT DOCUMENTS 6,586,781 B2 * 7/2003 Wu .................... H01L 29/66462
257/192
6,686,616 B1 * 2/2004 Allen .................. H01L 21/7605
257/280
(Continued)

FOREIGN PATENT DOCUMENTS

JP S61-278162 A 12/1986
JP 2006-302993 A 11/2006
(Continued)

OTHER PUBLICATIONS

"High Temperature, High Power RF Life Testing of GaN on SiC," Barr, Richardson RFPD, M/A-Com Technology Solutions, Apr. 6, 2012.*
(Continued)

*Primary Examiner* — Khaja Ahmad
(74) *Attorney, Agent, or Firm* — Studebaker & Brackett PC

(57) ABSTRACT

A method of manufacturing a nitride semiconductor device includes: forming a transistor having a gate electrode Schottky-joined to a nitride semiconductor layer; performing high-temperature annealing at a temperature of 200 to 360° C. for 8 to 240 hours on the transistor; and after the high-temperature annealing, performing RF burn-in by applying radiofrequency power to the transistor at a channel temperature of 180 to 360° C.

8 Claims, 4 Drawing Sheets

(51) Int. Cl.
　　*H01L 21/8252* (2006.01)
　　*H01L 29/20* (2006.01)
　　*H01L 29/205* (2006.01)
　　*H01L 29/778* (2006.01)
(58) Field of Classification Search
　　CPC .......... H01L 21/2636; H01L 21/02318; H01L 21/02329; H01L 21/02694; H01L 21/02664; H01L 21/02656; G01R 31/10; G01R 31/318577
　　See application file for complete search history.

(56) References Cited

U.S. PATENT DOCUMENTS

| | | | | |
|---|---|---|---|---|
| 8,502,323 | B2* | 8/2013 | Chen | H01L 29/7786 257/392 |
| 9,129,921 | B2* | 9/2015 | Sasaki | H01L 21/3245 |
| 9,219,112 | B2* | 12/2015 | Lochtefeld | H01L 29/04 |
| 2001/0033518 | A1* | 10/2001 | Ayadi | G11C 29/50 365/201 |
| 2002/0064893 | A1* | 5/2002 | Kono | H01L 21/6836 438/14 |
| 2005/0024076 | A1* | 2/2005 | Haji-Sheikh | G01R 31/275 324/750.05 |
| 2005/0218923 | A1* | 10/2005 | Kutsuna | G01R 31/2856 438/133 |
| 2006/0132167 | A1* | 6/2006 | Chen | G01R 31/2856 324/750.05 |
| 2006/0134891 | A1* | 6/2006 | Ohnuma | H01L 21/02057 438/482 |
| 2007/0018199 | A1* | 1/2007 | Sheppard | H01L 29/42316 257/200 |
| 2007/0054465 | A1* | 3/2007 | Currie | H01L 21/76254 438/455 |
| 2007/0114569 | A1* | 5/2007 | Wu | H01L 29/207 257/194 |
| 2007/0141731 | A1* | 6/2007 | Hemink | G11C 16/0483 438/14 |
| 2007/0164315 | A1* | 7/2007 | Smith | H01L 21/318 257/194 |
| 2007/0278518 | A1* | 12/2007 | Chen | H01L 29/66462 257/192 |
| 2008/0008855 | A1* | 1/2008 | D'Evelyn | C30B 9/00 428/141 |
| 2008/0121934 | A1 | 5/2008 | Matsuda | |
| 2008/0280425 | A1* | 11/2008 | Tanaka | B23K 26/0732 438/487 |
| 2009/0032820 | A1* | 2/2009 | Chen | H01L 29/7786 257/76 |
| 2009/0039361 | A1* | 2/2009 | Li | H01L 21/02381 257/94 |
| 2009/0068779 | A1* | 3/2009 | Nakahara | H01L 21/0237 438/47 |
| 2009/0120924 | A1* | 5/2009 | Moffatt | B23K 26/0626 219/385 |
| 2009/0190413 | A1* | 7/2009 | Hsu | G11C 29/04 365/189.09 |
| 2009/0206324 | A1* | 8/2009 | Hudait | H01L 21/02381 257/14 |
| 2010/0147835 | A1* | 6/2010 | Mulpuri | C23C 14/025 219/759 |
| 2011/0024796 | A1* | 2/2011 | Miyoshi | C30B 19/00 257/194 |
| 2011/0057232 | A1* | 3/2011 | Sheppard | H01L 29/0843 257/194 |
| 2011/0092057 | A1* | 4/2011 | Suvorov | H01L 21/0465 438/522 |
| 2011/0124164 | A1* | 5/2011 | Noda | H01L 21/268 438/166 |
| 2011/0227199 | A1* | 9/2011 | Hata | H01L 21/02381 257/616 |
| 2012/0225504 | A1* | 9/2012 | Hong | H01L 22/14 438/17 |
| 2013/0267046 | A1* | 10/2013 | Or-Bach | H01L 27/088 438/14 |
| 2014/0001640 | A1* | 1/2014 | Nishizawa | H01L 29/402 257/773 |
| 2014/0295635 | A1 | 10/2014 | Sasaki | |
| 2014/0319582 | A1* | 10/2014 | Kinoshita | H01L 29/778 257/194 |
| 2015/0064811 | A1* | 3/2015 | Sasaki | H01L 21/3245 438/10 |
| 2015/0099350 | A1* | 4/2015 | Srinivasan | H01L 21/3245 438/522 |
| 2015/0179780 | A1* | 6/2015 | Terano | H01L 29/66318 257/76 |
| 2015/0200286 | A1* | 7/2015 | Liu | H01L 29/66462 257/194 |
| 2015/0236649 | A1* | 8/2015 | Sato | H01L 22/32 330/2 |
| 2015/0279945 | A1* | 10/2015 | Francis | H01L 21/76254 257/77 |
| 2015/0369857 | A1* | 12/2015 | Nakamura | G01R 31/2855 438/15 |

FOREIGN PATENT DOCUMENTS

| | | |
|---|---|---|
| JP | 2008-130949 A | 6/2008 |
| JP | 2014-192352 A | 10/2014 |

OTHER PUBLICATIONS

"Investigating of Gallium Nitride Transistor Reliability Through Accelerated Life Testing and Modeling," Christiansen, AirForce, Dec. 2011.*
"Reliability of GaN/AlGaN HEMT MMIC Technology on 100-mm 4H-SiC," Gajewski et al., Cree, May 16, 2011.*
"3000+ Hours Continuous Operation of GaN-on-Diamond HEMTs at 350 C Channel Temperature," Ejeckam et al.*
"Application of Waveform Engineering to GaN HFET Characterisation and Class F Design," Roff, Jan. 2009.*
Conway_et_al(Accelerated RF Life Testing of GAN HFETs, 1-4244-0919-5/07/$25.00 © 2007 IEEE).*

* cited by examiner

-Prior Art-

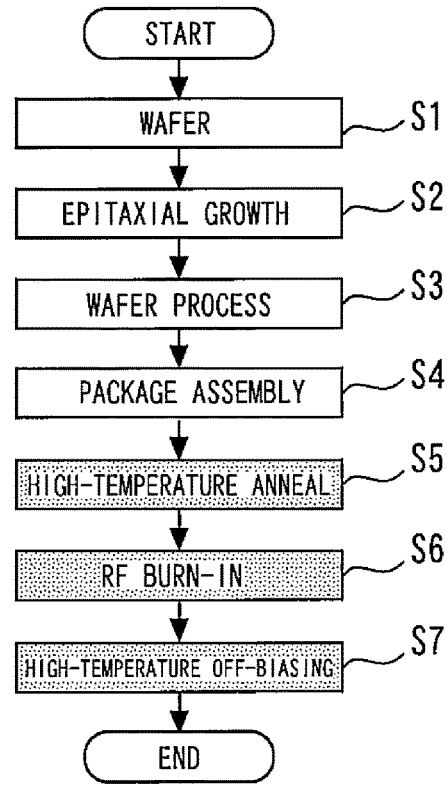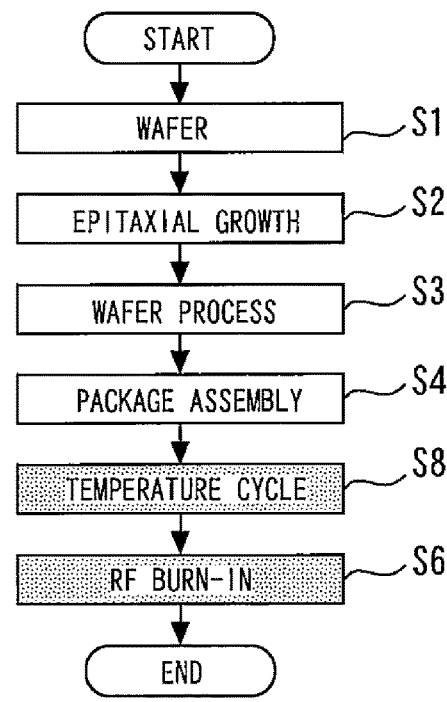

METHOD OF MANUFACTURING NITRIDE SEMICONDUCTOR DEVICE

BACKGROUND OF THE INVENTION

Field of the Invention

The present invention relates to a method of manufacturing a nitride semiconductor device used, for example, for amplification of a radiofrequency signal.

Background Art

Unlike a MOSFET, a radiofrequency device constituted by a nitride semiconductor has a gate leak current flowing when a gate-drain voltage is applied because the device has Schottky junction for its gate. It is said that degradation of the crystallinity of the semiconductor in the vicinity of the Schottky junction causes an increase in this gate leak current. When the gate leak current flows, a voltage drop occurs at an end of a gate resistor inserted in the circuit and the gate voltage is shifted to a higher positive value, resulting in a change in characteristic. Further, there is also a possibility of the device being broken by thermal runaway. It is also said that flowing of the gate leak current causes multiplication of crystal defects in the semiconductor and further increases the gate leak current.

Conventionally, in the process of manufacturing such a nitride semiconductor device, an RF burn-in step in which radiofrequency power is applied at a high temperature after a wafer process and package assembly is added to reduce the gate leak current and improve the reliability of the device. Also, a burn-in step in which DC stress is applied at a high temperature is added to reduce the gate leak current (see, for example, Japanese Patent Laid-Open No. 2014-192352).

SUMMARY OF THE INVENTION

Conventionally, radio-frequency burn-in or DC burn-in is performed to reduce the gate leak current. However, there is a demand for further reducing the gate leak current, for example, in a space system which needs to have high reliability.

In view of the above-described problem, an object of the present invention is to provide a method of manufacturing a nitride semiconductor device having a reduced gate leak current and having a longer life, improved operating stability and high reliability.

According to the present invention, a method of manufacturing a nitride semiconductor device includes: forming a transistor having a gate electrode Schottky joined to a nitride semiconductor layer; performing high-temperature annealing at a temperature of 200 to 360° C. for 8 to 240 hours on the transistor; and after the high-temperature annealing, performing RF burn-in by applying radiofrequency power to the transistor at a channel temperature of 180 to 360° C.

In the present invention, the gate leak current is reduced as a result of the process in which a transition of the state of process defects to a metastable state is first made by high-temperature annealing and a transition to a substantially complete stable state is thereafter made by RF burn-in. Thus, a nitride semiconductor device having a reduced gate leak current and having a longer life, improved operating stability and high reliability can be manufactured.

Other and further objects, features and advantages of the invention will appear more fully from the following description.

BRIEF DESCRIPTION OF THE DRAWINGS

FIG. 5 is a flowchart of a method of manufacturing a nitride semiconductor device according to a third embodiment of the present invention.

FIG. 6 is a flowchart of a method of manufacturing a nitride semiconductor device according to a fourth embodiment of the present invention.

DETAILED DESCRIPTION OF THE PREFERRED EMBODIMENTS

A method of manufacturing the nitride semiconductor device according to the embodiments of the present invention will be described with reference to the drawings. The same components will be denoted by the same symbols, and the repeated description thereof may be omitted.

First Embodiment

Figure 1:
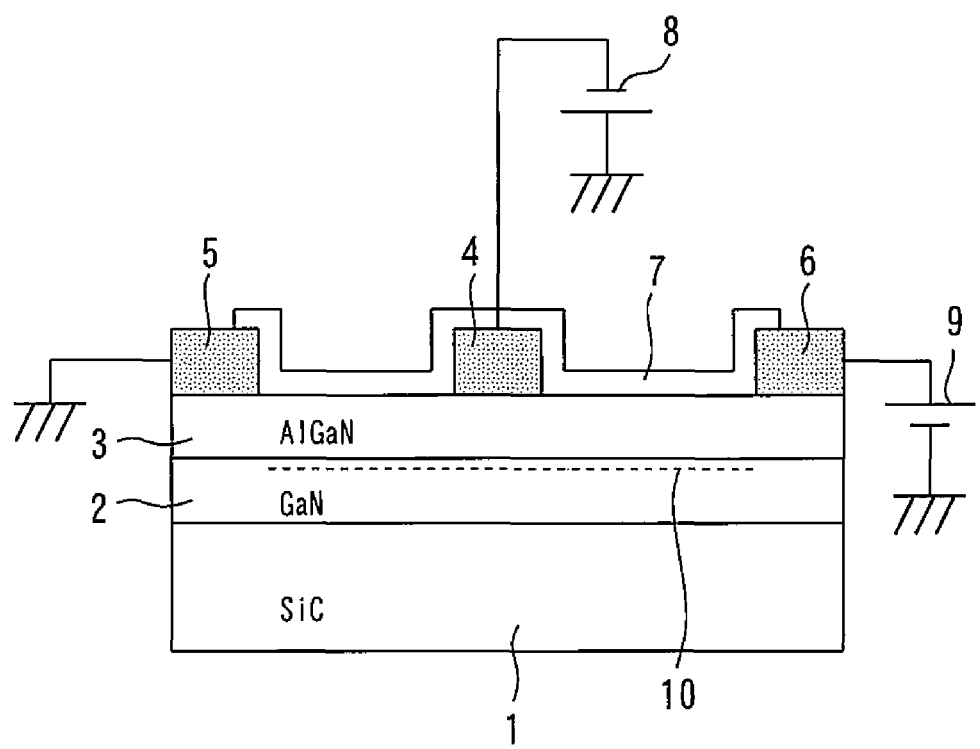
FIG. 1 is a sectional view of a nitride semiconductor device according to a first embodiment of the present invention.

FIG. 1 is a sectional view of a transistor according to a first embodiment of the present invention. A GaN buffer layer 2 and an AlGaN Schottky barrier layer 3 are successively laid on an SiC substrate 1. A gate electrode 4 Schottky-joined to the AlGaN Schottky barrier layer 3 and a source electrode 5 and a drain electrode 6 ohmic-joined to the AlGaN Schottky barrier layer 3 are formed. The gate electrode 4 and other portions are covered with a passivation film 7 formed of nitride film. The source electrode 5 is grounded, the gate electrode 4 is connected to a gate power supply 8, and a drain electrode 6 is connected to a drain power supply 9. A two-dimensional electron gas 10 (2DEG) is formed by spontaneous polarization and a piezoelectric effect due to the hetero junction between the AlGaN Schottky barrier layer 3 and the GaN buffer layer 2.

Figure 2:
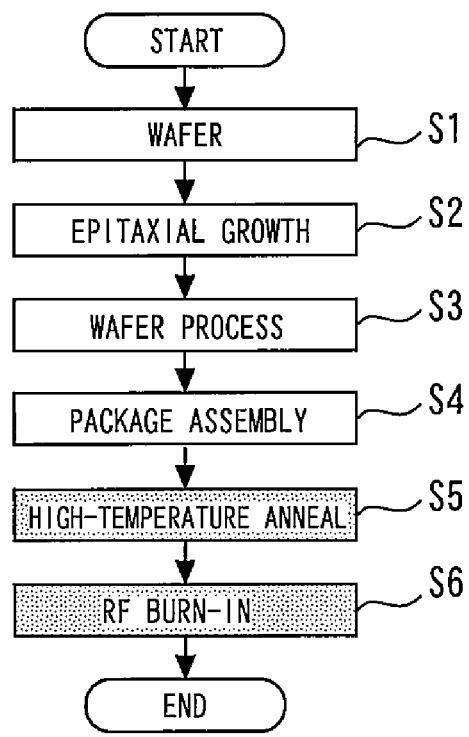
FIG. 2 is a flowchart of a method of manufacturing the nitride semiconductor device according to the first embodiment of the present invention.

FIG. 2 is a flowchart of a method of manufacturing the nitride semiconductor device according to the first embodiment of the present invention. First, the SiC substrate 1 in a wafer state is prepared (step S1). Next, the GaN buffer layer 2 and the AlGaN Schottky barrier layer 3 are successively grown epitaxially (step S2). The source electrode 5, the gate electrode 4, the drain electrode 6 and the passivation film 7 are thereafter formed in a wafer process, thereby forming the transistor shown in FIG. 1 (step S3). Next, the wafer on which the transistors are formed is divided into individual semiconductor chips and each semiconductor chip is built into a package (step S4), followed by high-temperature annealing at a temperature of 200 to 360° C. for 8 to 240 hours on the transistor (step S5). Next, RF burn-in is performed by applying radiofrequency power to the transistor at a channel temperature of 180 to 360° C. (step S6). The nitride semiconductor device is manufactured by the above-described process steps.

Figure 3:
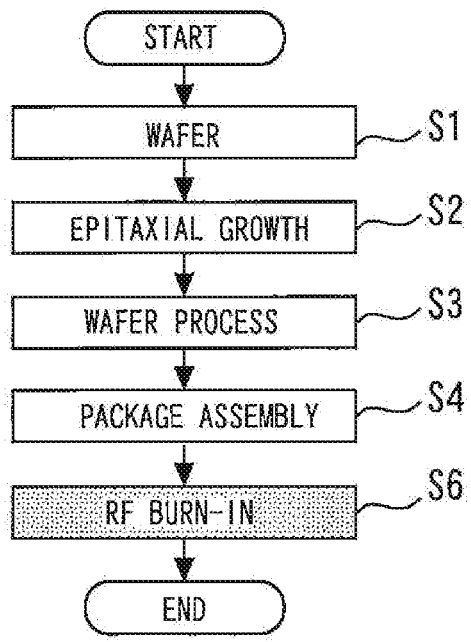
FIG. 3 is a flowchart of a method of manufacturing a nitride semiconductor device according to a comparative example.

The effects of the present embodiment will subsequently be described by comparing with a comparative example. FIG. 3 is a flowchart of a method of manufacturing a nitride semiconductor device according to a comparative example. In the comparative example, RF burn-in is performed after package assembly without high-temperature annealing. In the case where only RF burn-in is performed, a gate leak current reduction effect can be produced but is it not sufficiently high. If high-temperature annealing is performed before RF-burn in as in the present embodiment, the gate leak current can be further reduced.

Annealing conditions for this high-temperature annealing were examined and it was found that a sufficiently high effect can be obtained if annealing is performed in a nitrogen atmosphere in a temperature range from 200 to 360° C. for 8 to 240 hours. For RF burn-in conditions, input RF power Pin is set to about a compression level P of 2 dB, tuner matching is intentionally adjusted to a mismatch, and the channel temperature is increased to 180° C. or higher (180 to 360° C.).

Table 1 shows typical examples of the gate leak current in cases where high-temperature annealing and/or RF burn-in is performed. The gate leak current was measured by applying a reverse bias of −200 V between the gate and the drain. In the case where no preprocessing such as high-temperature annealing or RF burn-in was performed, the gate leak current in the device specified as described above was $8.1 \times 10^{-4}$ A. It was confirmed that in the case where 280° C. high-temperature annealing was performed, the gate leak current was reduced to $2.1 \times 10^{-4}$ A by annealing for 24 hours and was reduced to $1.8 \times 10^{-5}$ A by annealing for 96 hours. In the case where only RF burn-in was performed without high-temperature annealing, it was possible to reduce the gate leak current to $1.3 \times 10^{-5}$ A. In the case where 280° C. 96-hour high-temperature annealing and RF burn-in were performed in combination as in the present embodiment, it was possible to reduce the gate leak current to $7.5 \times 10^{-6}$ A.

TABLE 1

| Processing | Gate leak current (A) |
| --- | --- |
| No preprocessing | $8.1 \times 10^{-4}$ |
| High-temperature annealing (24 hours) | $2.1 \times 10^{-4}$ |
| High-temperature annealing (96 hours) | $1.8 \times 10^{-5}$ |
| RF burn-in | $1.3 \times 10^{-5}$ |
| High-temperature annealing (96 hours) + RF burn-in | $7.5 \times 10^{-6}$ |

In some ordinary cases, high-temperature annealing or RF burn-in is incorporated in a device manufacturing process. However, no instance of a combination of a high-temperature annealing at 200 to 360° C. for 8 to 240 hours and RF burn-in by intentionally increasing the channel temperature, such as that in the present embodiment, is heretofore known.

It is thought that phenomena such as described below occur in processings as phenomena relating to these gate leak current reduction effects. Process damage is applied to the semiconductor substrate in the device manufacturing process, particularly in the gate forming process step, thereby causing not negligible crystal defects such as point defects. In a nitride semiconductor device in particular, a high-melting-point metal such as Ni, Pt, Pd, TaN or WSiN is used as the gate electrode. There is, therefore, a need to form the metal with high energy, and the possibility of occurrence of crystal defects in the semiconductor is increased. If the crystal defects act as a donor, the potential is reduced, the thickness of the depletion layer of the gate Schottky barrier is reduced, and the probability of tunneling of electrons is increased, resulting in an increase in gate leak current. It is also said that electrons are conducted between generated defects by hopping conduction to cause a gate leak current.

High-temperature annealing is thought to have the effect of thermally stabilizing and annealing out the crystal defects, the effect of reducing small stresses produced around the defects, the effect of causing small amounts of hydrogen existing in the semiconductor, at the Schottky interface and at the interface between the semiconductor and the nitride film to enter a stable state, and other effects. The effects of high-temperature annealing, however, cannot be said to be adequate for complete recovery from the defective state when performed at a temperature of about 200 to 360° C. Although annealing at a higher temperature is effective, the metal electrodes including the gate, the drain and the source and the semiconductor react with each other, thereby causing degradation of the device. There is also a strong possibility of, for example, separation of the passivation film causing degradation such as peeling.

On the other hand, RF burn-in is a technique enabling annealing out defects even at a comparatively low temperature, i.e., a technique to generate electron-hole pairs by applying radiofrequency power and to cause recombination electrons and holes at defective portions so that energy is supplied to the defects.

It is thought that in the present embodiment the gate leak current is reduced as a result of the process in which a transition of the state of process defects to a metastable state is first made by high-temperature annealing and a transition to a substantially complete stable state is thereafter made by RF burn-in.

As shown in the flowchart of FIG. 3 showing the method of manufacturing a nitride semiconductor device according to the comparative example, RF burn-in is performed without high-temperature annealing. In this case, there is a possibility of the device being broken because radiofrequency power is abruptly applied to comparatively instable portions of defects. In the present embodiment, a transition of the state of instable defects to a metastable state is first made to enable elimination of the possibility of RF burn-in thereafter causing device breakage. Thus, the present embodiment demonstrates that a nitride semiconductor device having a reduced gate leak current and having a longer life, improved operating stability and high reliability can be manufactured.

High-temperature annealing is not performed exclusively in a nitrogen atmosphere. High-temperature annealing may be performed in a hydrogen atmosphere or in a heavy hydrogen atmosphere. Hydrogen or heavy hydrogen is used by being mixed in a range of 100 ppm to 100% in an inert gas such as nitrogen or argon gas. 100% of hydrogen or heavy hydrogen means a pure hydrogen or heavy hydrogen atmosphere. When high-temperature annealing is performed in a hydrogen atmosphere, a trace amount of hydrogen is diffused in the device through the nitride film. Diffused hydrogen bonds to dangling bonds of crystal defects to reduce the defect level. Further, in a case where heavy hydrogen is used, heavy hydrogen has such an isotopic effect in chemical reaction as to be capable of bonding to defects more strongly than hydrogen and maintaining the stable state once it bonds to dangling bonds and reduces the defect level. Also, when hydrogen or heavy hydrogen is used as a carrier gas in a process such as MOCVD or plasma CVD used in an epitaxial growth or wafer process, hydrogen or heavy hydrogen is taken in the device naturally, thereby obtaining a similar effect.

Second Embodiment

Figure 4:
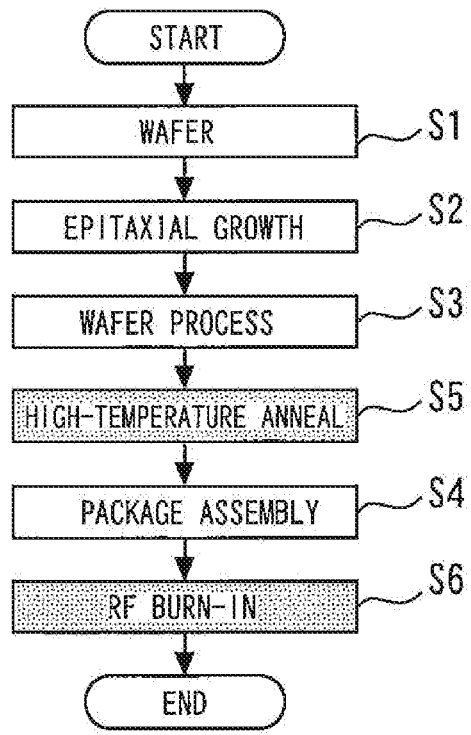
FIG. 4 is a flowchart of a method of manufacturing a nitride semiconductor device according to a second embodiment of the present invention.

FIG. 4 is a flowchart of a method of manufacturing a nitride semiconductor device according to a second embodiment of the present invention. In the first embodiment, there is a need to individually anneal each of chips or packages since high-temperature annealing is performed after package assembly. In the present embodiment, a wafer on which transistors are formed is divided into individual semiconductor chips after execution of high-temperature annealing, and each semiconductor chip is built into a package. High-temperature annealing is thus performed on the wafer immediately after the wafer process and before the wafer is divided, thereby enabling several thousands to several tens of thousands of chips to be annealed at a time and remarkably simplifying the operation.

Third Embodiment

FIG. 5 is a flowchart of a method of manufacturing a nitride semiconductor device according to a third embodiment of the present invention. After RF burn-in is performed, high-temperature off-biasing is performed at 125 to 250° C. for 1 to 96 hours by applying a gate voltage of −20 to −2 V to the gate electrode so that the off state is maintained (step S7). An ordinary voltage is applied to the drain electrode 6. By additionally applying high-temperature off-bias stress after RF burn-in in the first embodiment, an effect of capturing electrons by a deep defect level so that the potential is increased is produced. A further reduction in gate leak current can thereby be achieved.

Fourth Embodiment

FIG. 6 is a flowchart of a method of manufacturing a nitride semiconductor device according to a fourth embodiment of the present invention. 3 to 1000 temperature cycles in a range from −65 to 360° C. are applied to the transistor (step S8) instead of high-temperature annealing (step S5) in the first embodiment. Crystal defects, particularly dislocations can be reduced by performing temperature cycles. As thermal expansion and contraction are repeatedly caused, dislocations are moved in a crystal. For example, when two dislocations collide with each other, they combine into one dislocation, thereby reducing the number of dislocations. The number of dislocations can be reduced by causing recurrence of this action. The same can also be said with respect to point defects. The number of point defects can be reduced by causing collision of point defects and by causing point detects to be taken in dislocations. A nitride semiconductor device having a reduced gate leak current and having a longer life, improved operating stability and high reliability can thus be manufactured.

While the SiC substrate 1 is used as a supporting substrate in the first to fourth embodiments, the SiC substrate is not exclusively used. Any other substrate such as an Si substrate, a sapphire substrate or a GaN substrate capable of epitaxially growing a nitride may suffice. The same epitaxial structure is formed while only the material of the supporting substrate is changed. Therefore, the gate leak current can be reduced by high-temperature annealing and RF burn-in in the same way. In a case where an Si substrate is used, the device can be made at a reduced cost. An Si substrate has a large thermal expansion coefficient with respect to the nitride epitaxial growth and enables obtaining a further improved effect in the fourth embodiment in which temperature cycles are performed. Also in a case where a sapphire substrate is used, the device can be made at a reduced cost, as is that in the case where an Si substrate is used, and the effect of the temperature cycles is also obtained. In a case where a GaN substrate is used, there is no lattice mismatch between the substrate and the epitaxial growth; therefore, substantially no dislocation defects occur; defects which can occur are only process damage; and an ideal device in which substantially no gate leak current flows can be manufactured by removing the process damage by the method of the present invention.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-232808, filed on Nov. 17, 2014 including specification, claims, drawings and summary, on which the Convention priority of the present application is based, is incorporated herein by reference in its entirety.

What is claimed is:

1. A method of manufacturing a wafer comprising a plurality of nitride semiconductor devices comprising:
    forming a transistor having a gate electrode Schottky-joined to a nitride semiconductor layer;
    performing high-temperature annealing at a temperature of 200 to 360° C. for 8 to 240 hours on the transistor; and
    after the high-temperature annealing, performing RF burn-in by applying radiofrequency power to the transistor at a channel temperature of 180 to 360° C.,
    wherein the RF burn-in reduces a leak current of the Schottky-joined gate electrode, which is present after the high-temperature anneal prior to the RF burn-in.

2. The method of manufacturing the wafer comprising a plurality of nitride semiconductor devices of claim 1, wherein the high-temperature annealing is performed in a nitrogen atmosphere, in a hydrogen atmosphere or in a heavy hydrogen atmosphere.

3. The method of manufacturing the wafer comprising a plurality of nitride semiconductor devices of claim 1, further comprising:
    dividing a wafer on which the transistors are formed into individual semiconductor chips; and
    building the semiconductor chip into a package,
    wherein the high-temperature annealing is performed after building the semiconductor chip into the package.

4. The method of manufacturing the wafer comprising a plurality of nitride semiconductor devices of claim 1, further comprising:
    after the high-temperature annealing, dividing a wafer on which the transistors are formed into individual semiconductor chips; and
    building the semiconductor chip into a package.

5. The method of manufacturing the wafer comprising a plurality of nitride semiconductor devices of claim 1, further comprising, after the RF burn-in, performing high-temperature off-biasing at 125 to 250° C. for 1 to 96 hours by applying a gate voltage of −20 to −2 V to the gate electrode so that an off state is maintained.

6. A method of manufacturing a wafer comprising a plurality of nitride semiconductor devices comprising:
    forming a transistor having a gate electrode Schottky-joined to a nitride semiconductor layer;
    applying 3 to 1000 temperature cycles in a range from −65 to 360° C. to the transistor; and
    after the temperature cycles, performing RF burn-in by applying radiofrequency power to the transistor at a channel temperature of 180 to 360° C.,
    wherein the RF burn-in reduces a leak current of the Schottky-joined gate electrode, which is present after the temperature cycles prior to the RF burn-in.

7. The method of manufacturing the wafer comprising a plurality of nitride semiconductor devices of claim 1,
    wherein the RF burn-in is performed at a lower temperature than the high-temperature anneal.

8. The method of manufacturing the wafer comprising a plurality of nitride semiconductor devices of claim 6, wherein the RF burn-in is performed at a lower temperature than the high-temperature anneal.

* * * * *